United States Patent [19]
Taki

[11] Patent Number: 5,459,435
[45] Date of Patent: Oct. 17, 1995

[54] FREQUENCY SYNCHRONOUS CIRCUIT FOR OBTAINING ORIGINAL CLOCK SIGNAL BY REMOVING NOISE COMPONENTS

[75] Inventor: Yoshitaka Taki, Kawasaki, Japan

[73] Assignee: Fujitsu Limited, Kanagawa, Japan

[21] Appl. No.: 187,102

[22] Filed: Jan. 25, 1994

[30] Foreign Application Priority Data

Sep. 20, 1993 [JP] Japan .................................. 5-233330

[51] Int. Cl.$^6$ ...................................................... H03L 7/00
[52] U.S. Cl. .............................. 331/1 A; 331/14; 331/25; 375/354; 375/355; 375/356; 327/141; 327/155; 327/160; 327/162
[58] Field of Search ...................... 375/108, 111, 375/118, 119, 120, 354, 355, 356, 362, 371, 373, 376; 331/25, 1 A, 14, 17, 1 R; 327/99, 107, 155, 156, 160, 162, 141

[56] References Cited

U.S. PATENT DOCUMENTS 3,676,793  7/1972  Brown ................................... 331/14 X
3,893,040  7/1975  Harp ........................................ 331/1 A
4,716,575  12/1987 Douros et al. ............................. 375/3

FOREIGN PATENT DOCUMENTS 2100518  4/1990  Japan .

Primary Examiner—Robert J. Pascal
Assistant Examiner—Arnold Kinkead

[57] ABSTRACT

A frequency synchronous circuit has a first counter unit, a second counter unit, a storage/average unit, and a comparison unit. The first counter unit is used to count a reference signal supplied from outside the frequency synchronous circuit during a sampling time which is defined by a sampling signal, and the second counter unit is used to count a synchronous clock signal to be output from the frequency synchronous circuit during the sampling time of the sampling signal. The storage/average unit, which is operatively connected to the first counter unit, is used to store and average an output signal of the first counter unit. The comparison unit, which is connected to the storage/average unit and the second counter unit, is used to compare an output signal of the storage/average unit with an output signal of the second counter unit, and the frequency synchronous circuit outputs the synchronous clock signal whose frequency is synchronized in accordance with an output signal of the comparison unit. Therefore, an original clock signal can be obtained and output by removing noise components from a clock signal which may include the noise components.

12 Claims, 11 Drawing Sheets

FREQUENCY SYNCHRONOUS CIRCUIT FOR OBTAINING ORIGINAL CLOCK SIGNAL BY REMOVING NOISE COMPONENTS

BACKGROUND OF THE INVENTION

1. Field of the Invention

The present invention relates to a frequency synchronous circuit, and more particularly, to a frequency synchronous circuit used for a digital synchronous network in a communication system.

2. Description of the Related Art

Recently, in accordance with the requirements for realizing a digital synchronous network in a communication system, a very stable clock signal (reference signal) must be transmitted. Therefore, it is required to provide a frequency synchronous circuit which can pick up and output an original clock signal by removing noise (noise components) caused in a transmission line by various factors.

In a prior art frequency synchronous circuit, a very stable PLL (Phase Locked Loop) circuit having a VCXO (Voltage-Controlled Crystal (X-tal) Oscillator) is used. Nevertheless, in this prior art frequency synchronous circuit, the PLL operation may fluctuate in accordance with various factors, for example, a jitter and wander (which is jitter with a frequency of less than 10 Hz), especially the wander.

Therefore, in the prior art frequency synchronous circuit (PLL circuit), the cut-off frequency of the PLL circuit is reduced in order to decrease the influences of jitter and wander. However, for example, when the cut-off frequency of the PLL circuit is reduced, a pull-in range becomes narrow, and further, the capacitor elements required for a circuit (lag filter or lag/lead filter) having a low cut-off frequency must be large.

For example, in a path protection switch ring system of SONET (Synchronous Optical Network) or SDH (Synchronous Digital Hierarchy), a working line and protection line are provided, and when trouble such an accident, device trouble, or construction work causes one line (working line), the other line (protection line) is automatically selected and used. However, in this path protection switch ring system, when changing from the working line to the protection line, the phase of the clock signal (reference signal) fluctuates, since the frequencies of clock signals of the working and protection lines are the same but the phases of the clock signals of the working and protection lines are generally different.

Further, in the prior art PLL circuit, when the reference signal is not transmitted due to, for example, trouble on a communication line, the PLL circuit is operated by the VCXO in a free-runnig mode, and the so-called hold-over function is not provided for the PLL circuit.

As explained above, in the prior art PLL circuit (frequency synchronous circuit), it is difficult for the lag filter or lag/lead filter to reduce the cut-off frequency so as not to change the output signal by the wander frequency without unnecessarily expanding the pull-in range thereof. Further, in the prior art frequency synchronous circuit, when changing the working line to the protection line, and the like, the clock signals therebetween must be changed. In addition, the hold-over function cannot be provided for the prior art frequency synchronous circuit.

SUMMARY OF THE INVENTION

An object of the present invention is to provide a frequency synchronous circuit able to pick up and output an original clock signal by removing noise from a clock signal.

According to the present invention, there is provided a frequency synchronous circuit comprising a first counter unit for counting a reference signal supplied from outside the frequency synchronous circuit during a sampling time which is defined by a sampling signal; a second counter unit for counting a synchronous clock signal to be output from the frequency synchronous circuit during the sampling time of the sampling signal; a storage/average unit, operatively connected to the first counter unit, for storing and averaging an output signal of the first counter unit; and a comparison unit, connected to the storage/average unit and the second counter unit, for comparing an output signal of the storage/average unit with an output signal of the second counter unit, wherein the frequency synchronous circuit outputs the synchronous clock signal whose frequency is synchronized in accordance with an output signal of the comparison unit.

The output signal of the first counter unit may be determined in accordance with the frequency of the reference signal, and the output signal of the second counter unit may be determined in accordance with the frequency of the synchronous clock signal.

The frequency synchronous circuit may further comprise a data conversion unit, connected to the comparison unit, for converting the output signal of the comparison unit to digital data indicating a voltage level corresponding to the output signal of the comparison unit; a digital/analog converter unit, connected to the data conversion unit, for converting the digital data output from the data conversion unit into an analog voltage; a voltage controlled oscillator unit, connected to the digital/analog converter unit, for generating an output signal having a frequency corresponding to the analog voltage output from the D/A converter unit; and a divider unit, connected to the voltage controlled oscillator unit and the second counter unit, for dividing the output signal of the voltage controlled oscillator unit and for outputting the synchronous clock signal.

The frequency synchronous circuit may further comprise a first subtraction unit, connected to the first counter unit and the storage/average unit, for subtracting a specific value from the output signal of the first counter unit and for supplying the subtracted result to the storage/average unit; and a second subtraction unit, connected to the second counter unit and the storage/average unit, for subtracting the specific value from the output signal of the second counter unit and for supplying the subtracted result to the comparison unit. The specific value may be determined to be a center frequency of the reference signal.

The frequency synchronous circuit may further comprise a fault detection unit, receiving the reference signal, for detecting a fault in the reference signal; and a write operation stop control unit, connected to the fault detection unit and the storage/average unit, for stopping a write operation of writing new data to the storage/average unit, when a fault in the reference signal is detected, so that the synchronous clock signal is continuously output in accordance with the data stored in the storage/average unit.

The reference signal supplied to the first counter unit may comprise a plurality of pre-reference signals and the first counter unit comprises a plurality of counters corresponding to the pre-reference signals, and each of the counters may count the corresponding pre-reference signals during the sampling time of the sampling signal, respectively. The frequency synchronous circuit may further comprise a selector unit, connected to the plurality of the counters and the storage/average unit, for selecting one output signal from a plurality of output signals from the counters and for supplying the selected output signal to the storage/average unit.

The reference signal supplied to the first counter unit may comprise two pre-reference signals, and the first counter unit may comprise two counters corresponding to the two pre-reference signals. The frequency synchronous circuit may further comprise a selector unit, connected to the two counters and the storage/average unit, for selecting one output signal from the two counters and for supplying the selected one output signal to the storage/average unit.

The frequency synchronous circuit may be applied to a path protection switch ring system for a synchronous optical network or a synchronous digital hierarchy. The frequency synchronous circuit may further comprise a fault detection unit, receiving the pre-reference signals, for detecting a fault in the pre-reference signals; and a write operation stop control unit, connected to the fault detection unit and the storage/average unit, for stopping a write operation for writing new data to the storage/average unit, when a fault in the pre-reference signals is detected, so that the synchronous clock signal is continuously output in accordance with the data stored in the storage/average unit.

BRIEF DESCRIPTION OF THE DRAWINGS

The present invention will be more clearly understood from the description of the preferred embodiments as set forth below with reference to the accompanying drawings, wherein.

DESCRIPTION OF THE PREFERRED EMBODIMENTS

First, a principle configuration of a frequency synchronous circuit according to the present invention will be explained with reference to FIG. 1.

Figure 1:
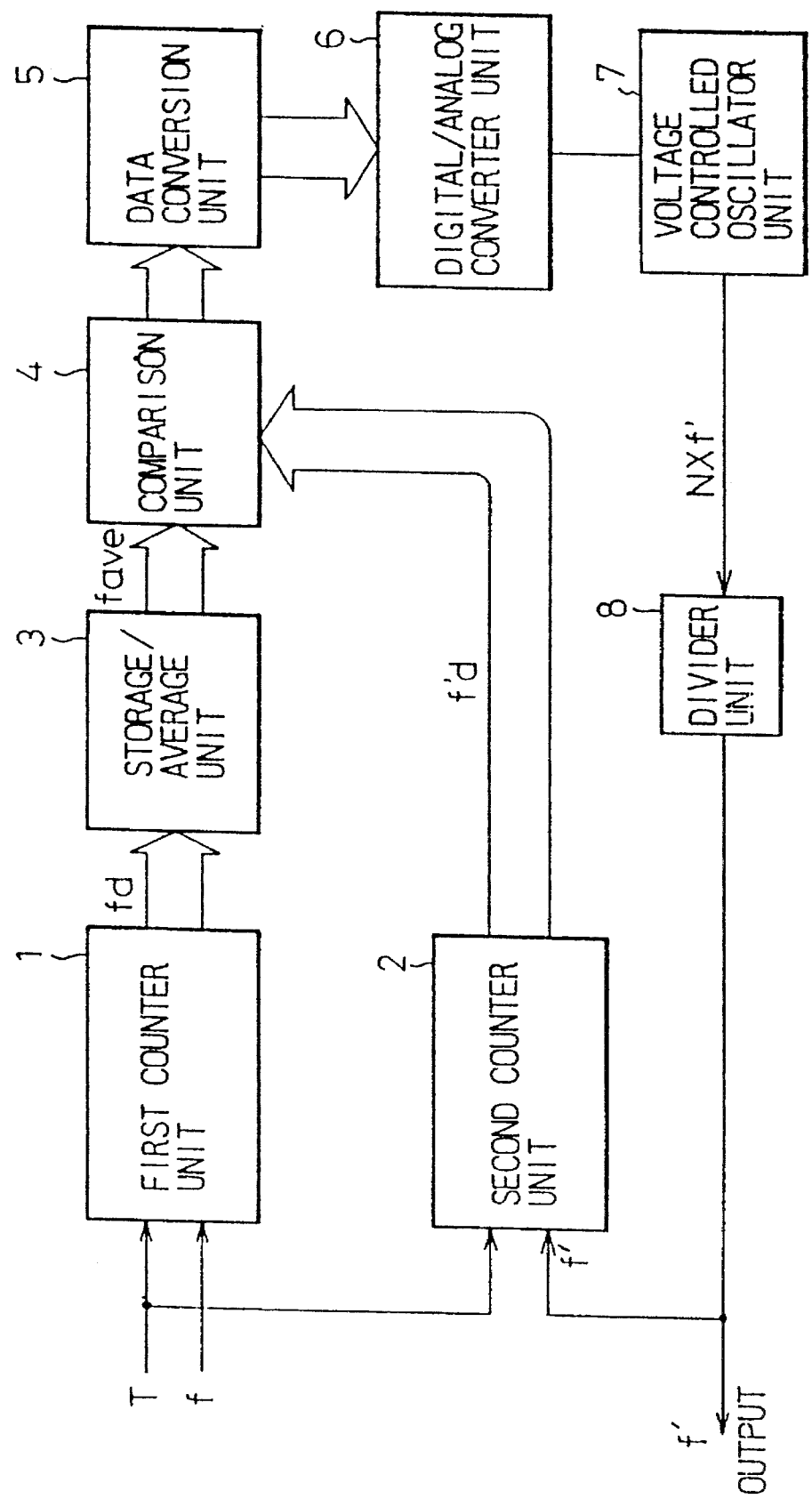
FIG. 1 is a block diagram showing a principle configuration of a frequency synchronous circuit according to the present invention.

FIG. 1 shows a principle configuration of a frequency synchronous circuit according to the present invention. In FIG. 1, reference numeral 1 denotes a first counter unit, 2 denotes a second counter unit, 3 denotes a storage/average unit, and 4 denotes a comparison unit. Further, reference numeral 5 denotes a data conversion unit, 6 denotes a digital/analog converter unit, 7 denotes a voltage controlled oscillator unit, and 8 denotes a divider unit.

As shown in FIG. 1, the frequency synchronous circuit of the present invention comprises the first counter unit 1, second counter unit 2, storage/average unit 3, and comparison unit 4.

The first counter unit 1 is used to count a reference signal f supplied from outside the frequency synchronous circuit during a sampling time (T) which is defined by a sampling signal T, and the second counter unit 2 is used to count a synchronous clock signal f' to be output from the frequency synchronous circuit during the sampling time (T) of the sampling signal T.

The storage/average unit 3, which is operatively connected to the first counter unit 1, is used to store and average an output signal from the first counter unit 1, and the comparison unit 4, which is connected to the storage/average unit 3 and second counter unit 2, is used to compare an output signal from the storage/average unit 3 with an output signal of the second counter unit 2. Note that the frequency synchronous circuit outputs the synchronous clock signal f' whose frequency is synchronized in accordance with an output signal of the comparison unit 4. Further, the output signal of the first counter unit 1 is determined in accordance with the frequency of the reference signal f, and the output signal of the second counter unit 2 is determined in accordance with the frequency of the synchronous clock signal f'.

Further, as shown in FIG. 1, the frequency synchronous circuit of the present invention further comprises the data conversion unit 5, digital/analog converter unit 6, voltage controlled oscillator unit 7, and divider unit 8.

The data conversion unit 5, which is connected to the comparison unit 4, is used to convert the output signal of the comparison unit 4 to digital data indicating a voltage level corresponding to the output signal of the comparison unit 4, and the digital/analog converter unit 6, which is connected to the data conversion unit 5, is used to convert the digital data output from the data conversion unit 5 into an analog voltage.

The voltage controlled oscillator unit 7, which is connected to the digital/analog converter unit 6, is used to generate a signal (N×f') having a frequency corresponding to the analog voltage output from the D/A converter unit 6, and the divider unit 8, which is connected to the voltage controlled oscillator unit 7 and second counter unit 2, is used to divide the output signal of the voltage controlled oscillator unit 7 and for outputting the synchronous clock signal f'.

According to the frequency synchronous circuit of the present invention, the reference signal f is counted during the sampling time of the sampling signal T, and the synchronous clock signal f' is counted during the sampling time of the sampling signal T. Further, the output signal of the first counter unit 1 is stored and averaged by the storage/average unit 3, and the output signal of the storage/average unit 3 is supplied to the comparison unit 4 to be compared with the output signal of the second counter unit 2. Therefore, the synchronous clock signal f' synchronizing with the frequency corresponding to the output signal of the comparison unit 4.

As described above, according to the present invention, the reference signal (clock signal) f including noise is counted by the sampling signal T and averaged, and then, compared with the counted value of the synchronous clock signal f' by the second counter unit 2 in accordance with the sampling signal T. Consequently, the synchronous clock signal f' (the original clock signal) can be picked up without including the noise (noise components).

Below, embodiments of a frequency synchronous circuit according to the present invention will be explained with reference to the drawings.

Figure 2:
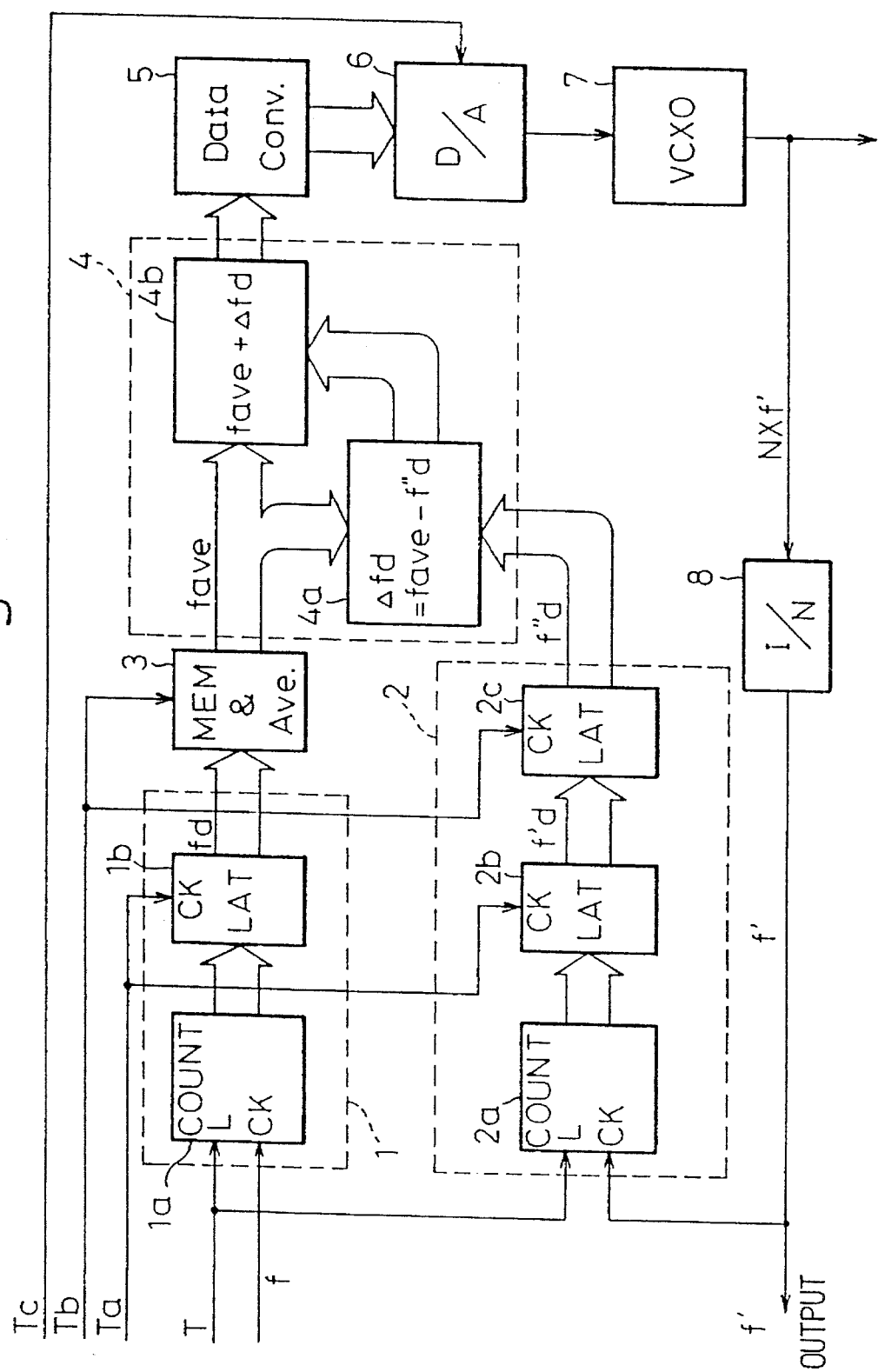
FIG. 2 is a block diagram showing a first embodiment of a frequency synchronous circuit of the present invention.
Figure 3:
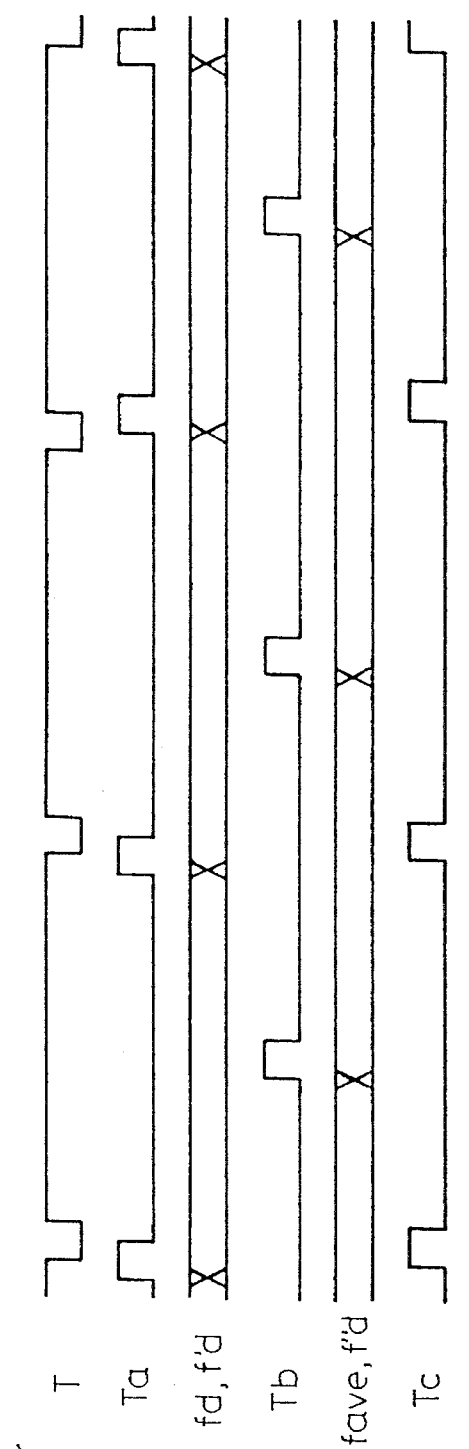
FIG. 3 is a timing chart for explaining the operation of the frequency synchronous circuit shown in FIG. 2.

FIG. 2 shows a first embodiment of a frequency synchronous circuit of the present invention, and FIG. 3 is a timing chart for explaining the operation of the frequency synchronous circuit shown in FIG. 2.

In FIG. 2, reference numeral 1 denotes a counter unit (first frequency counter) for counting the frequency of a reference signal f, 2 denotes a counter unit (second frequency counter) for counting the frequency of an output signal (synchronous clock signal) f' of a divider 8, and 3 denotes a storage/average unit 3 for storing the value counted by the first frequency counter 1 during a specific period and for averaging the counted value. Further, in FIG. 2, reference numeral 4 denotes a frequency comparison unit (comparison unit) for comparing the averaged frequency of the storage/average unit 3 with the output frequency of the second frequency counter 2, 5 denotes a data conversion unit for converting the compared results of the frequency comparison unit 4 into voltage data, 6 denotes a D/A (digital/analog) converter for converting the voltage data output from the data conversion unit 5 into an analog voltage, 7 denotes a VCXO (Voltage-Controlled X-tal Oscillator), and 8 denotes the divider which is described above.

The first frequency counter 1 comprises a counter circuit 1a and a latch circuit 1b, and the second frequency counter 2 comprises a counter circuit 2a and latch circuits 2b and 2c. The counter circuit 1a counts the reference signal f, which is supplied to a clock terminal CK of the counter circuit 1a from outside the frequency synchronous circuit, during a sampling time (T: for example, specified to be 1 sec. or 10 sec.) of a sampling signal T.

Similarly, the counter circuit 2a counts the output signal (synchronous clock signal) f' of the divider 8, which is supplied to a clock terminal CK of the counter circuit 2a, during a sampling time (T) of a sampling signal T. Note that the synchronous clock signal f' is output from the frequency synchronous circuit.

An output signal of the counter circuit 1a is supplied to the storage/average unit 3 through the latch circuit 1b which is controlled by a control signal Ta. Further, an output signal of the counter circuit 2a is supplied to the storage/average unit 3 through the latch circuits 2b and 2c. Note that the latch circuit 2b is controlled by the control signal Ta and the latch circuit 2c is controlled by a control signal Tb. Further, the control signal Tb is supplied to the storage/average unit 3. This latch circuit 2b is used only to synchronized the timing of the output signal (f"d) of the second frequency counter 2 with the output signal (fave) of the storage/average unit 3 at the frequency comparison unit 4.

The storage/average unit 3 comprises M stages of memory, and calculates an average value of the M stages. Namely, the storage/average unit 3 calculates an average frequency during M×T seconds. Therefore, frequency components (noise components of jitter and wander) higher than 1/(M×T) Hz can be removed.

The frequency comparison unit 4 compares the data (averaged data) output from the storage/average unit 3 with the data output from the second frequency counter 2, and the result is supplied to the data conversion unit 5. Namely, the frequency comparison unit 4 comprises a difference detection portion 4a and a compensation portion 4b. The difference detection portion 4a is used to obtain a difference (Δfd) by subtracting data (f"d) output from the second frequency counter 2 from an averaged data (fave) output from the storage/average unit 3, and the compensation portion 4b is used to compensate (fave+Δfd) the data to be output to the data conversion unit 5 based on the detected results of the difference detection portion 4a. Namely, the output data of the frequency comparison unit 4 is determined by adding the difference Δfd (which is obtained by the difference detection portion 4a) to the averaged data fave (output from the storage/average unit 3).

The data conversion unit 5 is used to convert the output data of the frequency comparison unit 4 into voltage data by using a table such a ROM, or the like. Further, D/A converter 6 is used to convert the voltage data (digital data) output from the data conversion unit 5 into an analog voltage. Note that the D/A converter 6 is supplied with the control signal Tc. Further, the sampling signal T and control signals Ta, Tb, Tc have the same time period (for example, 1 sec. or 10 sec.), but the phases thereof are different from each other (with reference to FIG. 3).

As shown in FIG. 3, the output data (output signal) fd of the latch circuit 1b and the output data f'd of the latch circuit 2b are changed in accordance with the control signal Ta, and the output data fave of the storage/average unit 3 and the output data f"d of the latch circuit 2c are changed in accordance with the control signal Tb.

The analog voltage output from the D/A converter 6 is used for a control voltage of the VCXO 7, and the VCXO 7 generates a signal having a frequency (N×f') corresponding to the analog voltage. Further, the divider 8 is used to divide the frequency (N×f') generated by the VCXO 7 into 1/N, and thus, the frequency of the output signal of the divider 8 is determined to be f'. Note that the divided output signal (synchronous clock signal) f' of the divider 8 is supplied to the second frequency counter 2.

In the above descriptions, in accordance with making larger the number of the memory stages M of the storage/average unit 3 and making larger the value of the sampling signal T, the lower frequency noise can be removed. Further, the pull-in range of the frequency synchronous circuit can be expanded to cover any frequency produced by the VCXO 7, since the pull-in range depends on the characteristics of the data conversion unit 5 regardless the value (period) of the sampling signal T and the number of the memory stages M of the storage/average unit 3. Further, when the reference signal f supplied from outside the frequency synchronous circuit is not supplied, the previous data (average frequency previous to the reference signal f not being supplied) of the storage/average unit 3 is fixed and is continuously output by stopping the data writing operation for the storage/average unit 3, so that the VCXO 7 can be operated in accordance with the average frequency just before the reference signal f was not supplied.

Figure 4:
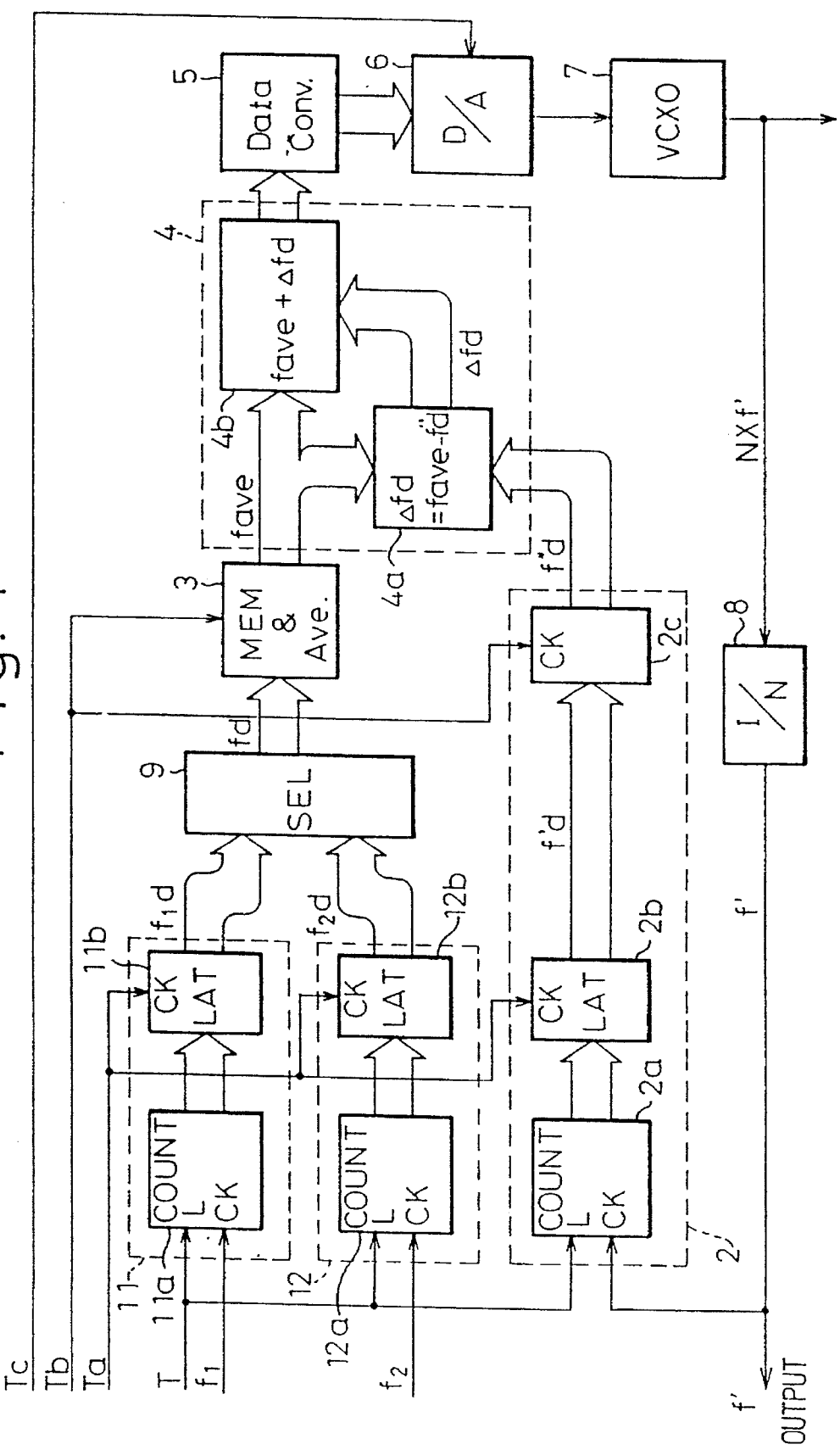
FIG. 4 is a block diagram showing a second embodiment of a frequency synchronous circuit of the present invention.

FIG. 4 shows a second embodiment of a frequency synchronous circuit of the present invention. As shown in FIG. 4, this second embodiment has two first frequency counters 11 and 12, and further has a selector 9 for selecting one output signal from the two first frequency counters 11 and 12.

Incidentally, in a path protection switch ring system of SONET (Synchronous Optical Network) or SDH (Synchronous Digital Hierarchy), which will be explained with reference to FIGS. 9 and 10, two transmission lines constituted by a working line and a protection line are provided. In this path protection switch ring system for SONET or SDH, when a problem such an accident, device trouble, or construction work causes one transmission line (working line) to fail, the other transmission line (protection line) is automatically selected and used. Note that the second embodiment of the present invention can be constituted to be applied to the above path protection switch ring system.

In the second embodiment of the present invention, for example, when applying this second embodiment to a path protection switch ring system for SONET or SDH, a frequency counter 11 having a counter circuit 11a and a latch circuit 11b is provided for a reference signal $f_1$ of the working line, and similarly, a frequency counter 12 having a counter circuit 12a and a latch circuit 12b is provided for a reference signal $f_2$ of the protection line. In this second embodiment, these counter circuits 11a, 12a and latch circuits 11b, 12b are the same as the counter circuit 1a and the latch circuit 1b in the first embodiment.

The selector 9 is used to select between an output signal $f_1d$ of the frequency counter 11 and an output signal $f_2d$ of the frequency counter 12, and is used to supply the selected output signal to the storage/average unit 3. Note that the other configurations of the second embodiment are the same as those of the first embodiment described above, and thus the explanations thereof are omitted. Further, in the following embodiments of the present invention, the explanations for the same configuration units as those of the first embodiment are also omitted.

In the second embodiment of the frequency synchronous circuit of the present invention, for example, when the first reference-signal $f_1$ used for the working line is defective, the second reference signal $f_2$ used for the protection line is selected and used. Note that the frequency of the second reference signal $f_2$ is basically equal to that of the first reference signal $f_1$, but the phase of the second reference signal $f_2$ is not usually the same as that of the first reference signal $f_1$.

In this second embodiment of the present invention, even though the phase of the second reference signal $f_2$ is different from that of the first reference signal $f_1$, the digital value $f_1d$ counted by the frequency counter 11 is changed to the digital value $f_2d$ counted by the frequency counter 12 by the selector 9, and the selected digital value is supplied to the storage/average unit 3. Further, the average data (fave) averaged by the storage/average unit 3 and the data (f"d) output from the second frequency counter 2 are supplied to the frequency comparison unit 4 to be compared. Consequently, in the second embodiment of the present invention, even though the phase of the second reference signal $f_2$ is different from that of the first reference signal $f_1$, the reference signal can be changed without causing a phase fluctuation.

Figure 5:
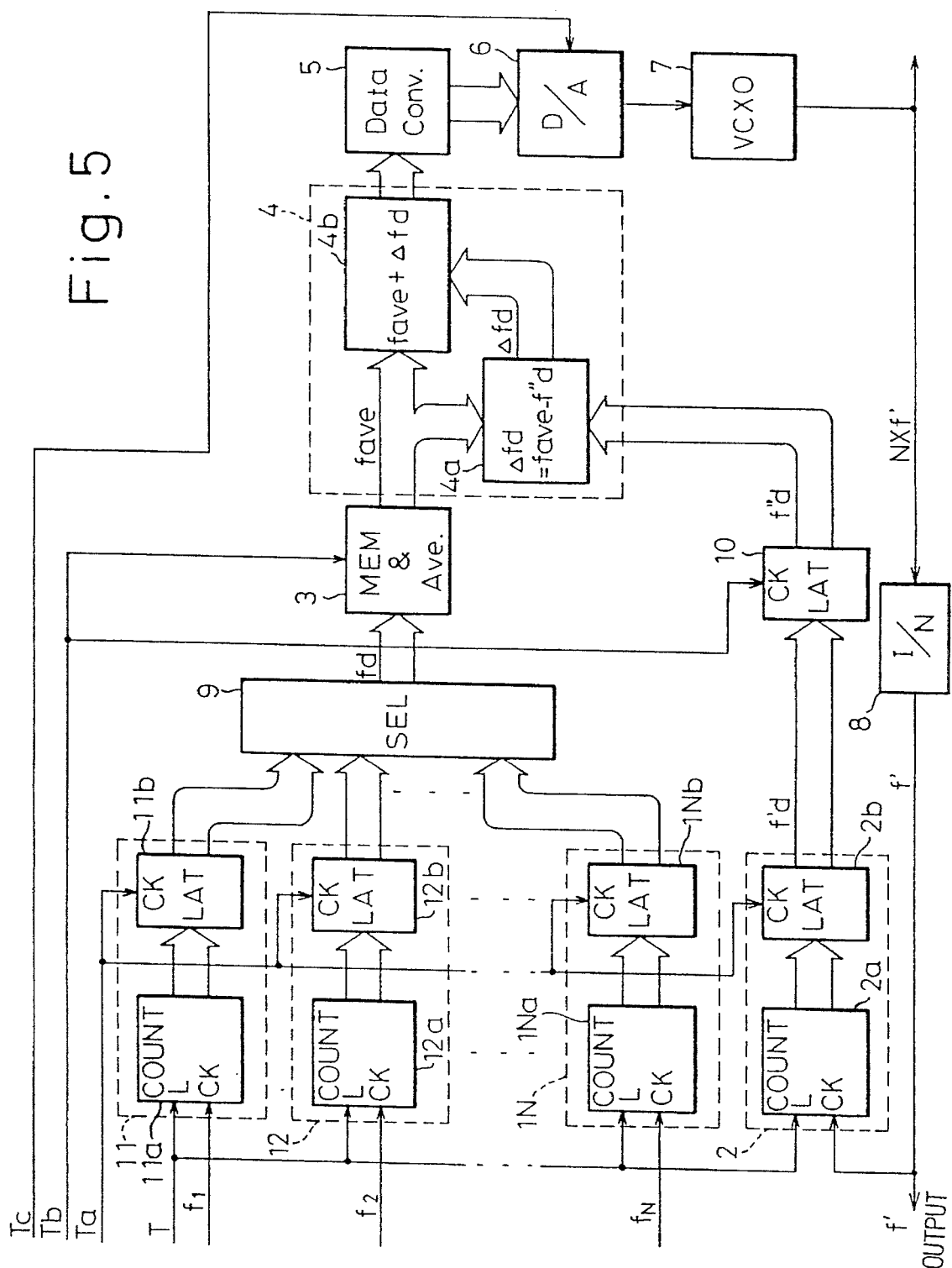
FIG. 5 is a block diagram showing a third embodiment of a frequency synchronous circuit of the present invention.

FIG. 5 shows a third embodiment of a frequency synchronous circuit of the present invention.

This third embodiment of the present invention has N groups (11 to 1N) of frequency counters instead of the two frequency counters (11, 12) of the second embodiment. Further, the selector 9 of the third embodiment is used to select (1:N) one output signal from output signals of the N groups of frequency counters 11 to 1N, where the selector 9 of the second embodiment is used to select (1:2) one output signal between the two output signals ($f_1d$, $f_2d$) of the frequency counters 11, 12. Therefore, all clock signals ($f_1$ to $f_N$) each used for a reference signal can be optionally selected without causing phase fluctuation.

Figure 6:
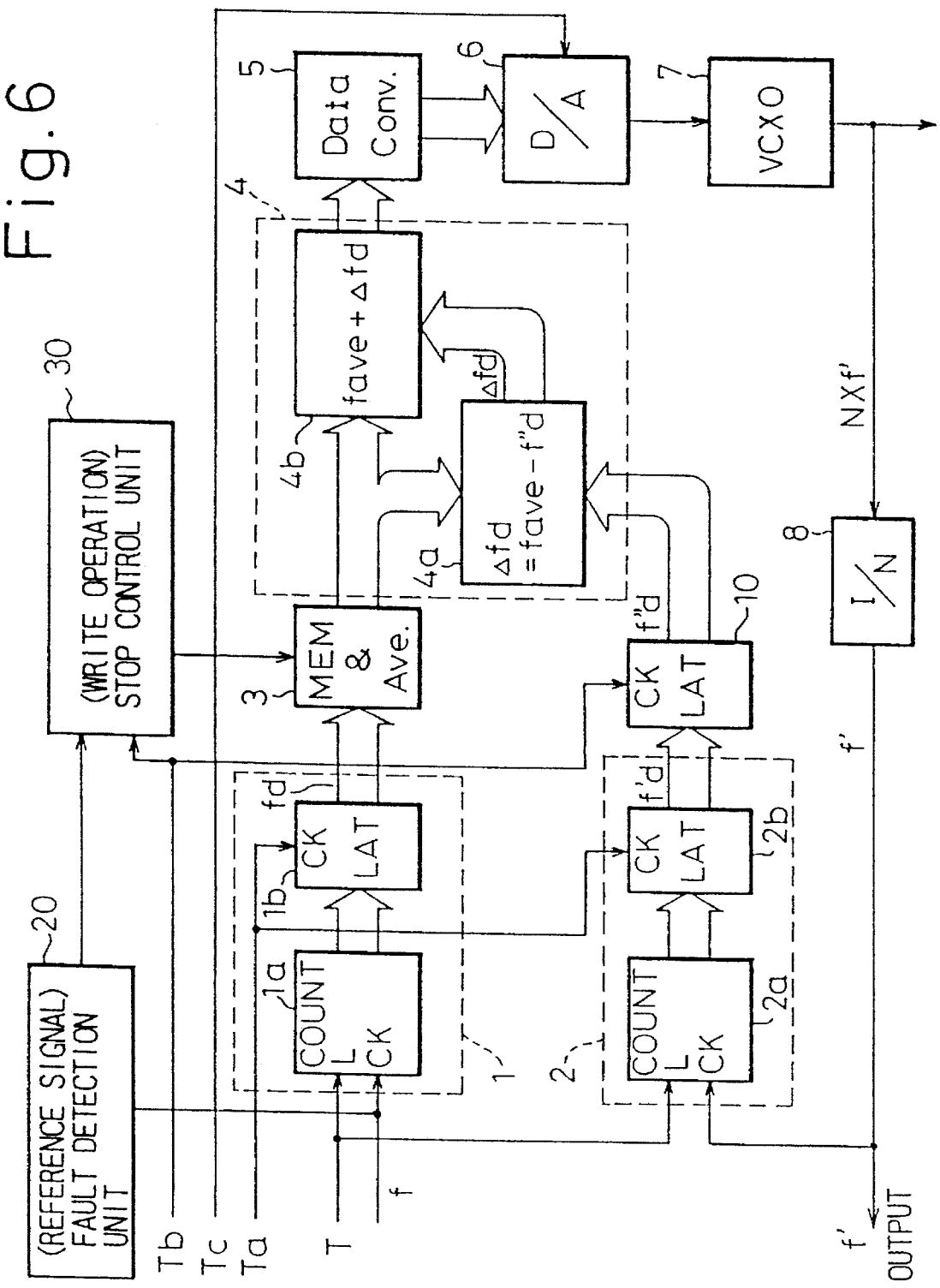
FIG. 6 is a block diagram showing a fourth embodiment of a frequency synchronous circuit of the present invention.

FIG. 6 shows a fourth embodiment of a frequency synchronous circuit of the present invention. In FIG. 6, reference numeral 10 denotes a latch circuit, 20 denotes a reference signal fault detection unit (fault detection unit), and 30 denotes a write operation stop control unit (stop control unit).

The fault detection unit 20 is used to detect a fault (or defect) in the reference signal, and the stop control unit 30 is used to stop a writing operation of the output of the first frequency counter 1 to a memory unit (storage/average unit 3) in accordance with the output of the fault detection unit 20. The latch circuit 10 is used only to synchronize the timing of the output signal of the frequency counter 2 with the output signal of the storage/average unit 3 at the frequency comparison unit 4.

In the fourth embodiment of the present invention, the operation of the fourth embodiment is the same as that of the first embodiment during a normal operation (stable state). However, when the fault detection unit 20 detects a fault in the reference signal f, a control signal is output to the stop control unit 30, and then the stop control unit 30 controls the storage/average unit (memory unit) 3 to not fetch new data output from the first frequency counter 1. Therefore, the storage/average unit 3 continuously averages the data just before detecting the fault (defect) of the reference signal f and continues to output the previous averaged data to the frequency comparison unit 4.

In the frequency comparison unit 4, the averaged data (fave) output from the storage/average unit 3 before detected fault is compared with the data (f"d) output from the second frequency counter 2 through the latch circuit 10. Consequently, when a fault (defect) is caused the reference signal f, the timing before the trouble appeared on the reference signal f can be maintained.

Figure 7:
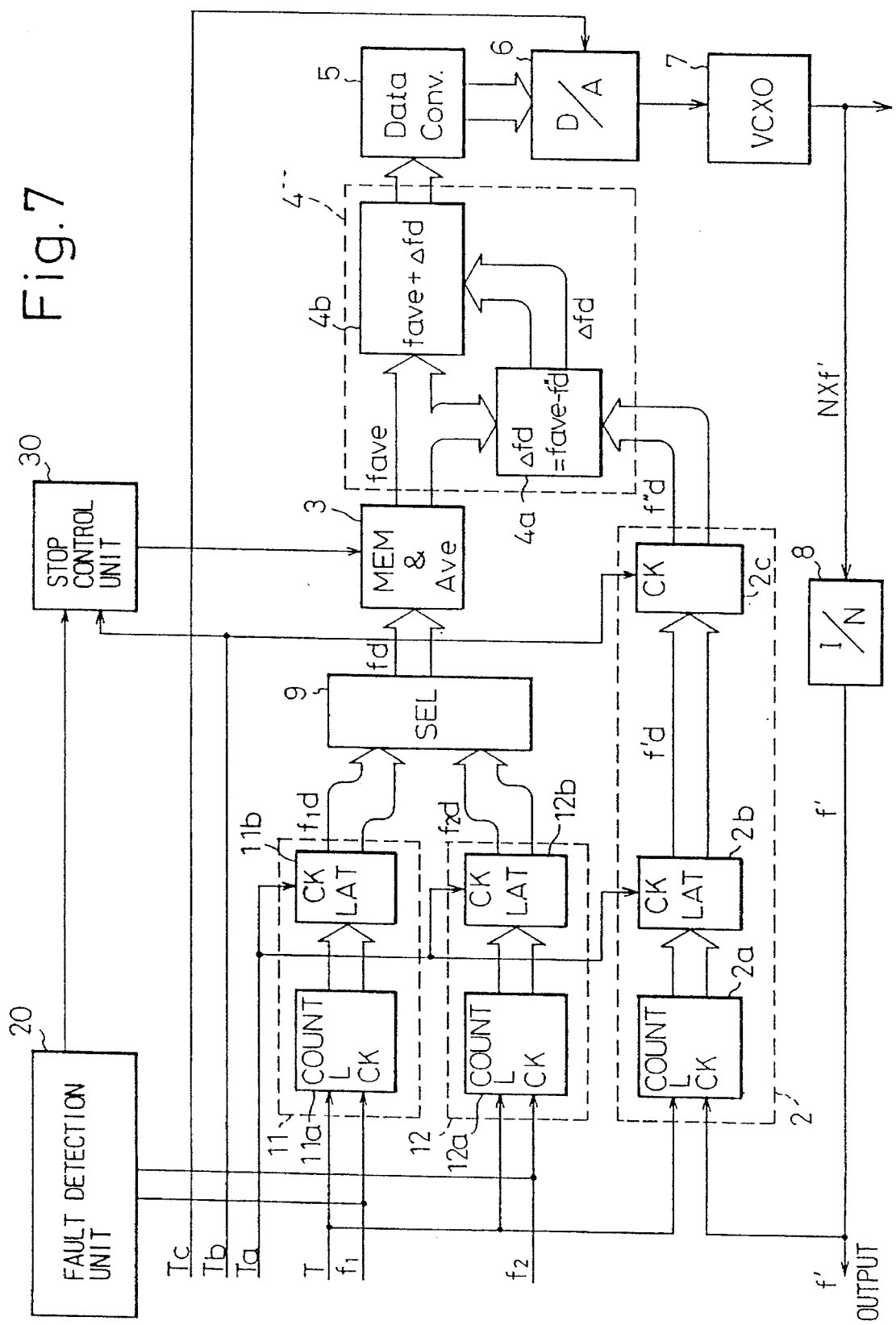
FIG. 7 is a block diagram showing a fifth embodiment of a frequency synchronous circuit of the present invention.

FIG. 7 shows a fifth embodiment of a frequency synchronous circuit of the present invention, which is the embodiment applying the above fourth embodiment to the second embodiment shown in FIG. 4. Further, FIG. 8 shows a sixth embodiment of a frequency synchronous circuit of the present invention, which is the embodiment applying the above fourth embodiment to the third embodiment shown in FIG. 5.

In the fifth embodiment, as shown in FIG. 7, when both two reference signals $f_1$ and $f_2$ are defective, or when these two reference signals $f_1$ and $f_2$ are not supplied from outside the frequency synchronous circuit because of the fault detection unit 20, the stop control unit 30 controls the storage/average unit 3 not to fetch new data output from the selector 9. Therefore, the storage/average unit 3 continuously averages the data prior to detecting the fault in the two reference signals $f_1$ and $f_2$ and to continues to output the previous averaged data to the frequency comparison unit 4. Further, when one reference signal $f_1$ is defective and the selector 9 selects another reference signal $f_2$ instead of the one reference signal $f_1$, the stop control unit 30 may control the storage/average unit 3 not to fetch new data output from the selector 9, so that the storage/average unit 3 outputs the previous averaged data to the frequency comparison unit 4 during the switching period (selecting period) between the two reference signals $f_1$ and $f_2$.

Figure 8:
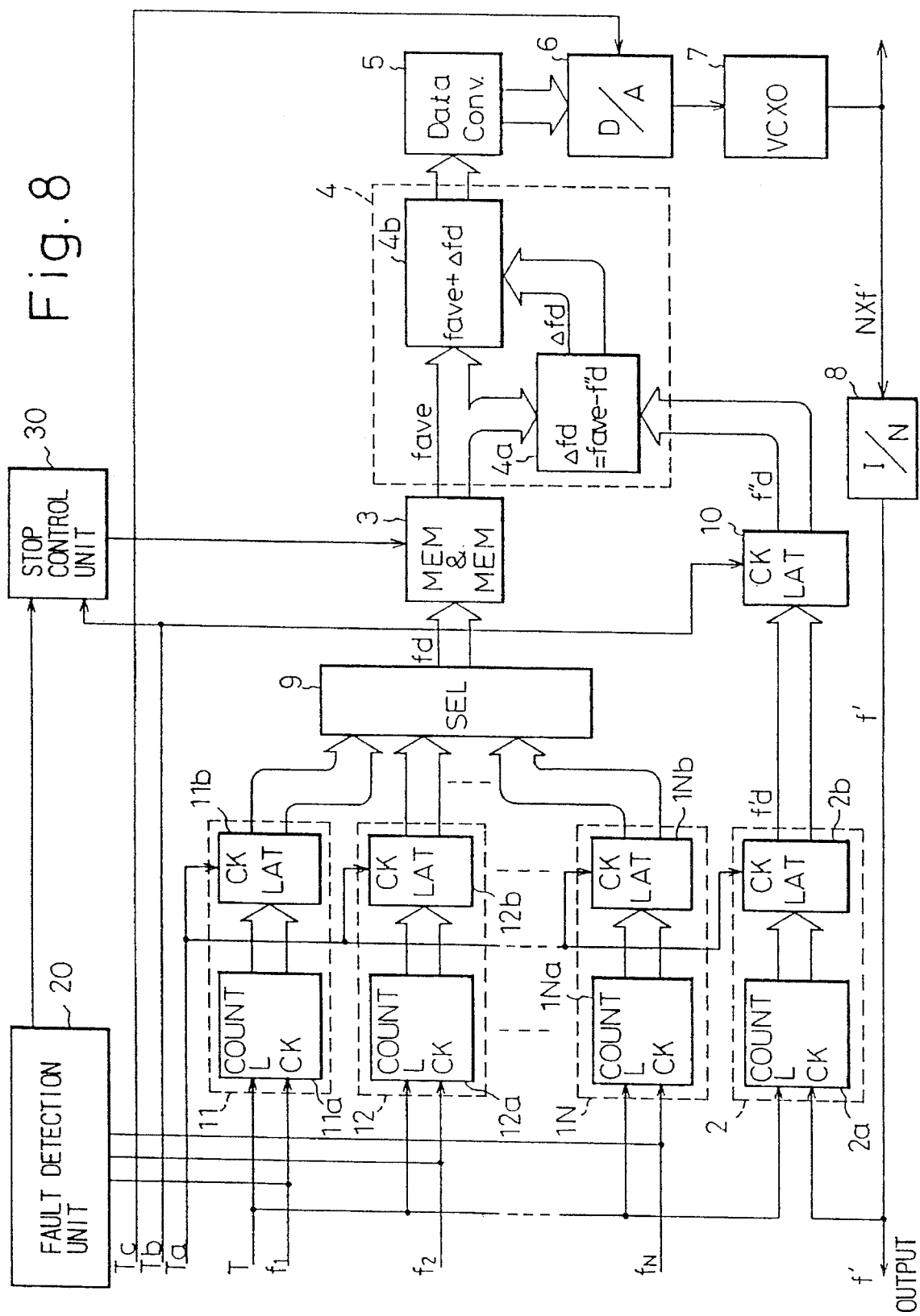
FIG. 8 is a block diagram showing a sixth embodiment of a frequency synchronous circuit of the present invention.

In the sixth embodiment, as shown in FIG. 8, when all reference signals $f_1$ to $f_N$ are defective, or when these reference signals $f_1$ to $f_N$ are not supplied from outside the frequency synchronous circuit by using the fault detection unit 20, the stop control unit 30 control the storage/average unit 3 not to fetch new data output from the selector 9. Therefore, the storage/average unit 3 continuously averages the data prior to detecting the fault in the reference signals $f_1$ to $f_N$ and to continue to output the previous averaged data to the frequency comparison unit 4. Further, when one reference signal is defective and the selector 9 selects another one reference signal instead of the one reference signal, the stop control unit 30 may control the storage/average unit 3 not to fetch new data output from the selector 9, so that the storage/average unit 3 output the previous averaged data to the frequency comparison unit 4 during the switching period (selecting period) between the two reference signals.

As described above, the configuration of the fourth embodiment can be applied to the second and third embodiments (fifth and sixth embodiments). In the fourth to sixth embodiments of the present invention, when all reference signals (f; $f_1$, $f_2$; $f_1$ to $f_N$) are defective, or when all reference signals are not supplied, the above mode using the fault detection unit 20 and the stop control unit 30 is established, so that the reliability and stability of the synchronous network can be increased.

Figure 9:
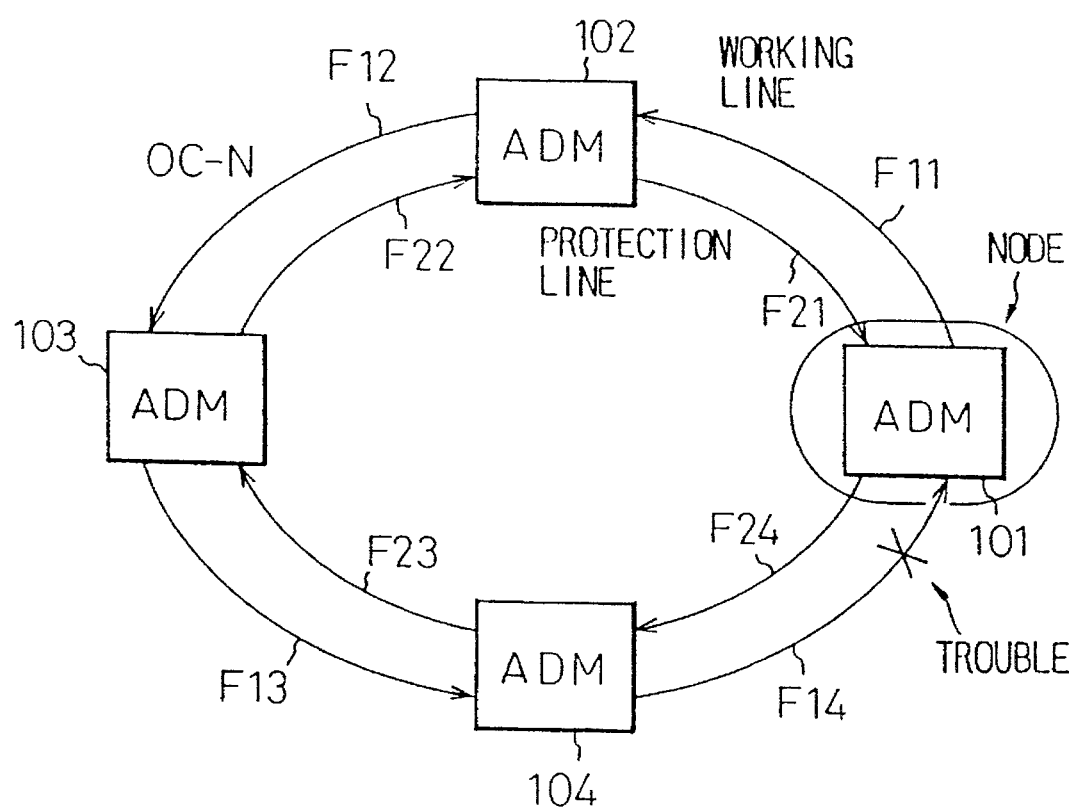
FIG. 9 is a diagram schematically showing an example of a path protection switch ring system of a synchronous optical network (SONET) which is applied with a frequency synchronous circuit of the present invention.

FIG. 9 shows an example of a path protection switch ring system of a synchronous optical network (SONET) which uses a frequency synchronous circuit of the present invention. In FIG. 9, reference numerals 101, 102, 103, and 104 denote ADMs (Adaptive Delta Modulators) corresponding to nodes, F11, F12, F13, and F14 denote working optical fibers, and F21, F22, F23, and F24 denote protection optical fibers.

As shown in FIG. 9, for example, the path protection switch ring system of the SONET comprises an anticlockwise working line (working transmission line) and a clockwise protection line (protection transmission line). The working line is constituted by connecting the ADMs 101, 102, 103,104 and the optical fibers F11, F12, F13, F14, and the protection line is constituted by connecting the ADMs 101, 102, 103, 104 and the optical fibers F21, F22, F23, F24. Note that in the path protection switch ring system, an anticlockwise working line is generally used.

Figure 10:
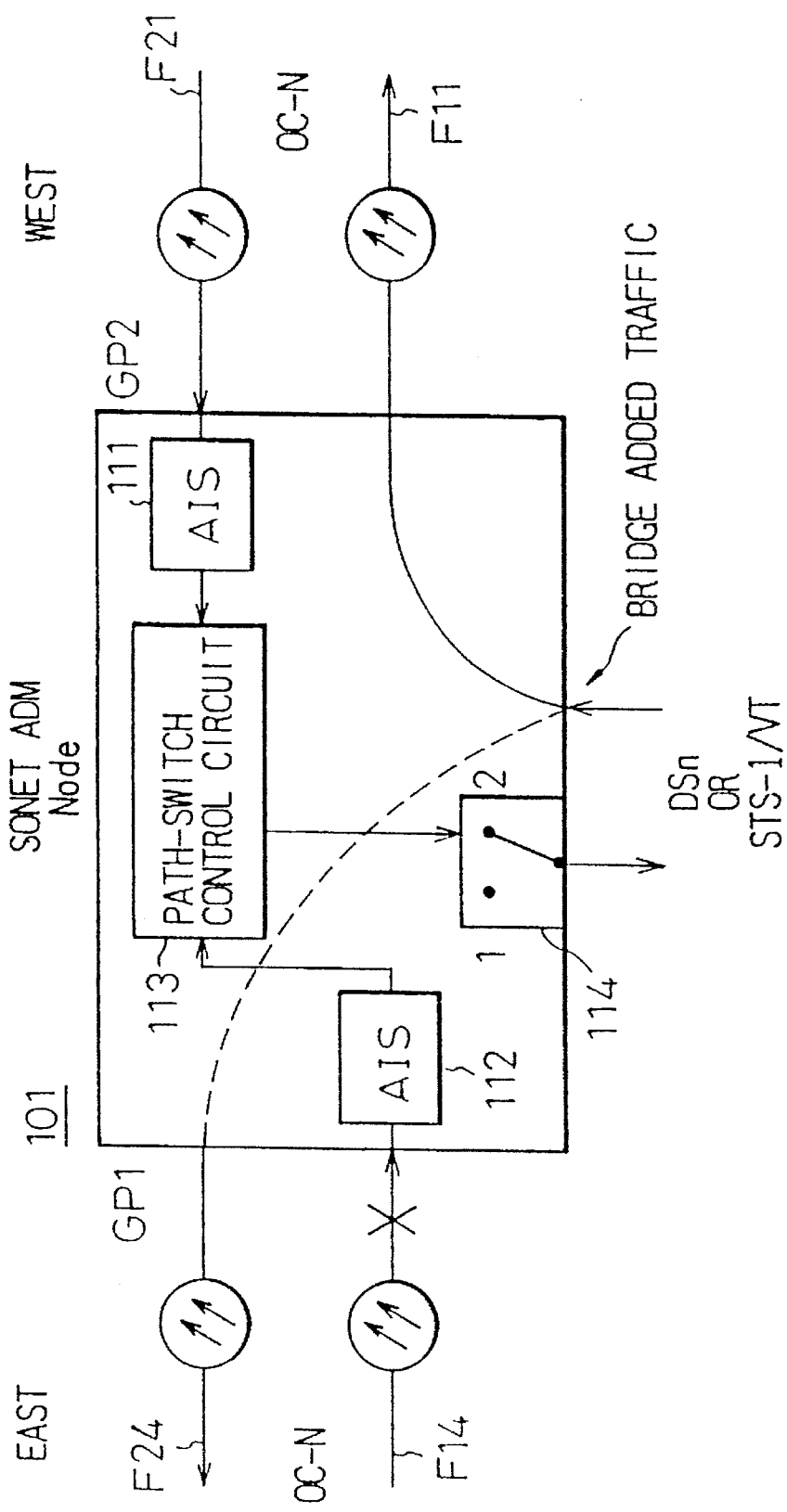
FIG. 10 is a diagram schematically showing a configuration of an adaptive delta modulation (ADM) in order to explain an operation of the path protection switch ring system shown in FIG. 9.

FIG. 10 schematically shows a configuration of an ADM 101 in order to explain an operation of the path protection switch ring system shown in FIG. 9. In FIG. 10, reference numerals 111 and 112 denote AIS (Alarm Indication Signal) detection circuits, 113 denotes a path-switch control circuit, and 114 denotes a path-switch.

As shown in FIGS. 9 and 10, in general service condition, the anticlockwise working line having the optical fibers F11, F12, F13, F14 is used. For example, when a trouble or accident (for example, a cutting of the optical fiber F14) is caused in the optical fiber F14 used for the working line, an AIS (Alarm Indication Signal, which is a signal where all bits are "1") is output, and the AIS is detected by the AIS detection circuit 112. Further, an output of the AIS detection circuit 112 is supplied to the path-switch 113, so that the trouble of the working line is confirmed and a selection signal is output to the path-switch 114. Note that this switching operation is carried out in each of the ADMs 101 to 104, and then the protection line of clockwise rotation having the optical fibers F21, F22, F23, F24 is automatically selected and used. Consequently, in the path protection switch ring system, when the working line cannot be used, the protection line is automatically selected and used, so that service can be continued.

As described in the above with reference to FIGS. 9 and 10, for example, the reference signal $f_1$ of the second embodiment (with reference to FIG. 4) is determined to be a clock signal of the working line, and the reference signal $f_2$ of the second embodiment is determined to be a clock signal of the protection line.

Figure 11:
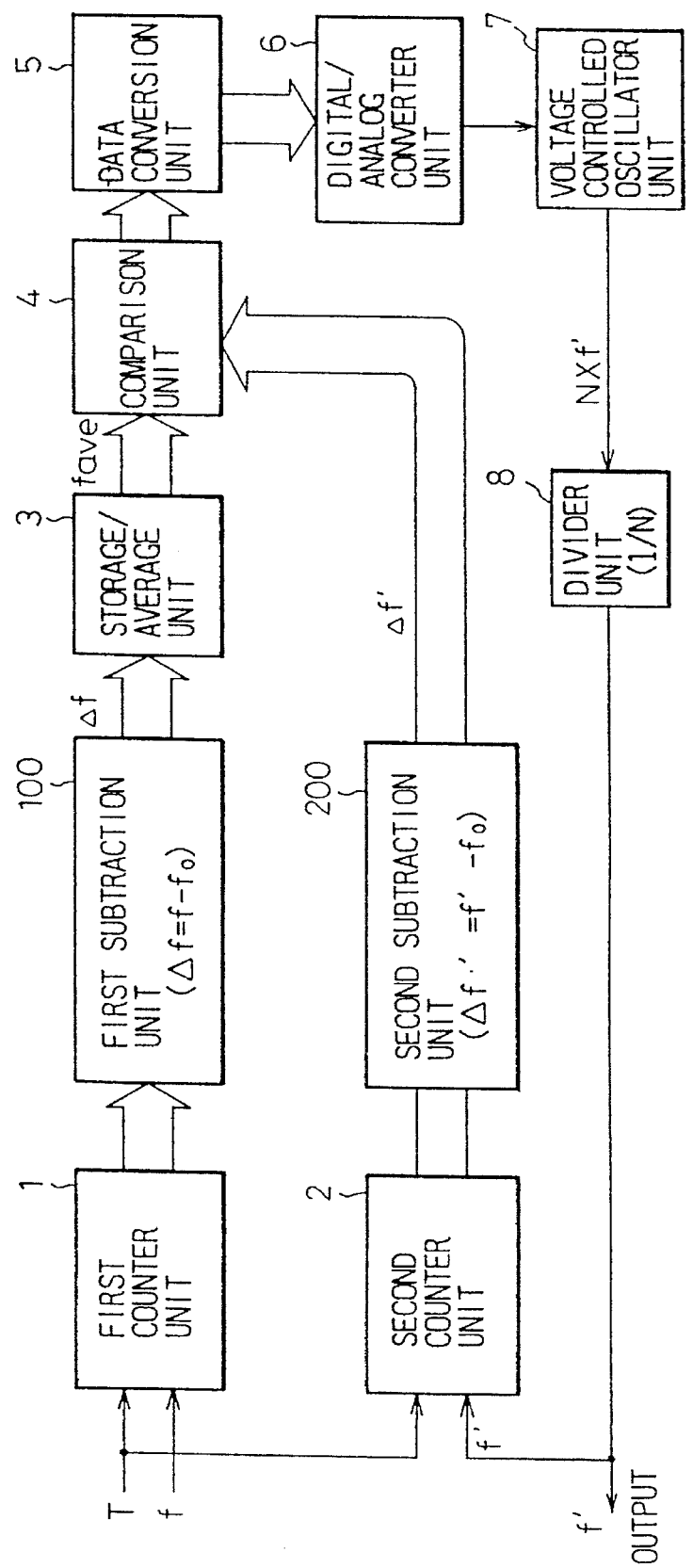
FIG. 11 is a block diagram showing a principle configuration of a frequency synchronous circuit according to another aspect of the present invention.

FIG. 11 shows a principle configuration of a frequency synchronous circuit according to another aspect of the present invention. In FIG. 11, reference numeral 100 denotes a first subtraction unit (first subtraction processing unit), and 200 denotes a second subtraction unit (second subtraction processing unit). Namely, in the frequency synchronous circuit of FIG. 11, the first subtraction unit 100 is inserted between the first frequency counter 1 and the storage/average unit 3, and the second subtraction unit 200 is inserted between the second frequency counter 2 and the frequency comparison unit 4. Note that the first subtraction unit 100 is used to subtract a specific value ($f_0$) from the output (f) of the first counter unit 1 ($\Delta f=f-f_0$), and the second subtraction unit 200 is used to subtract the above described specific value ($f_0$) from the output of the second counter unit 2 ($\Delta f' =f'-f_0$). Further, the specific value $f_0$ can be determined to be a center frequency of the reference signal f.

The output ($\Delta f$) of the first subtraction unit 100 is supplied to the frequency comparison unit 4 through the storage/average unit 3, and then the output ($\Delta f$) of the first subtraction unit 100 is compared with the output ($\Delta f'$) of the second subtraction unit 200 in the frequency comparison unit 4. Namely, in the frequency comparison unit 4, the difference between the frequency of the actual reference signal f and the center frequency $f_0$ of the reference signal is compared with the difference between the frequency of the synchronous clock signal (output of the divider 8) f' and the center frequency $f_0$ of the reference signal. The other configurations are the same as that of the first embodiment of the present invention.

Therefore, when the center frequency ($f_0$) of the reference signal coincides with the frequency of the actual reference signal (f), the data of the storage/average unit (memory) 3 is determined to be "0". Consequently, the frequency discrepancy at the time of power ON can be decreased by setting the data of the storage/average unit 3 to be all "0" as an intial value. Further, the number of bits to be processed in the storage/average unit 3 and the frequency comparison unit 4 can be decreased, and thus the circuit magnitude can be decreased.

As described above, according to a frequency synchronous circuit of the present invention, an original clock signal can be obtained and output by removing noise components from a clock signal having the noise components which are caused by various factors. Further, according to the frequency synchronous circuit of the present invention, the phase fluctuation caused by the change of reference signals can be decreased, and a specific timing can be continuously maintained when a fault is caused in the reference signal.

Many different embodiments of the present invention may be constructed without departing from the spirit and scope of the present invention, and it should be understood that the present invention is not limited to the specific embodiments described in this specification, except as defined in the appended claims.

I claim:

1. A frequency synchronous circuit comprising:

a first counter means for counting a reference signal supplied from outside said frequency synchronous circuit during a sampling time which is defined by a sampling signal;

a second counter means for counting a synchronous clock signal to be output from said frequency synchronous circuit during the sampling time of said sampling signal;

a storage and average means, operatively connected to said first counter means, for storing and averaging an output signal of said first counter means; and a comparison means, connected to said storage and average means and said second counter means, for comparing an output signal of said storage and average means with an output signal of said second counter means, wherein said frequency synchronous circuit outputs the synchronous clock signal whose frequency is synchronized in accordance with an output signal of said comparison means.

2. A frequency synchronous circuit as claimed in claim 1, wherein the output signal of said first counter means is determined in accordance with a frequency of the reference signal, and the output signal of said second counter means is determined in accordance with a frequency of the synchronous clock signal.

3. A frequency synchronous circuit as claimed in claim 1, wherein said frequency synchronous circuit further comprises:

a data conversion means, connected to said comparison means, for converting the output signal of said comparison means to digital data indicating a voltage level corresponding to the output signal of said comparison means;

a digital/analog converter means, connected to said data conversion means, for converting the digital data output from said data conversion means into an analog voltage;

a voltage controlled oscillator means, connected to said digital/analog converter means, for generating an output signal having a frequency corresponding to the analog voltage output from said D/A converter means; and a divider means, connected to said voltage controlled oscillator means and said second counter means, for dividing the output signal of said voltage controlled oscillator means and for outputting the synchronous clock signal.

4. A frequency synchronous circuit as claimed in claim 1, wherein said frequency synchronous circuit further comprises:

a first subtraction means, connected to said first counter means and said storage and average means, for subtracting a specific value from the output signal of said first counter means and for supplying the subtracted result to said storage and average means; and a second subtraction means, connected to said second counter means and said storage and average means, for subtracting the specific value from the output signal of said second counter means and for supplying the subtracted result to said comparison means.

5. A frequency synchronous circuit as claimed in claim 4, wherein the specific value is determined to be a center frequency of the reference signal.

6. A frequency synchronous circuit as claimed in claim 1, wherein said frequency synchronous circuit further comprises:

a fault detection means, receiving the reference signal, for detecting a fault in the reference signal; and a write operation stop control means, connected to said fault detection means and said storage and average means, for stopping a write operation of writing new data to said storage and average means, when a fault in the reference signal is detected, so that the synchronous clock signal is continuously output in accordance with the data stored in said storage and average means.

7. A frequency synchronous circuit as claimed in claim 1, wherein at least one additional reference signal is supplied to said first counter means, said first counter means including a plurality of counters, each of said counters counting a respective one of said reference signals during the sampling time of said sampling signal.

8. A frequency synchronous circuit as claimed in claim 7, wherein said frequency synchronous circuit further comprises a selector means, connected to said plurality of counters and to said storage and average means, for selecting one output signal from a plurality of output signals from said counters and for supplying the selected output signal to said storage and average means.

9. A frequency synchronous circuit as claimed in claim 7, wherein two reference signals are supplied to said first counter means, and said first counter means includes two counters corresponding respectively to the two reference signals.

10. A frequency synchronous circuit as claimed in claim 9, wherein said frequency synchronous circuit further comprises a selector means, connected to said two counters and to said storage and average means, for selecting one output signal from said two counters and for supplying the selected one output signal to said storage and average means.

11. A frequency synchronous circuit as claimed in claim 7, wherein said frequency synchronous circuit is applied to a path protection switch ring system for one of a synchronous optical network and a synchronous digital hierarchy.

12. A frequency synchronous circuit as claimed in claim 7, wherein said frequency synchronous circuit further comprises:

a fault detection means, receiving the reference signals, for detecting a fault in the reference signals; and a write operation stop control means, connected to said fault detection means and to said storage and average means, for stopping a write operation for writing new data to said storage and average means, when a fault in the reference signals is detected, the synchronous clock signal being continuously output in accordance with the data stored in said storage and average means.

* * * * *